US007598776B2

(12) United States Patent
Zhou

(10) Patent No.: US 7,598,776 B2
(45) Date of Patent: Oct. 6, 2009

(54) PROGRAMMING CIRCUIT WITH FEEDBACK CIRCUIT

(75) Inventor: Wei Zhou, Shenzhen (CN)

(73) Assignees: Innocom Technology (Shenzhen) Co., Ltd., Shenzhen, Guangdong Province (CN); Innolux Display Corp., Miao-Li County (TW)

( * ) Notice: Subject to any disclaimer, the term of this patent is extended or adjusted under 35 U.S.C. 154(b) by 0 days.

(21) Appl. No.: 12/005,725

(22) Filed: Dec. 28, 2007

(65) Prior Publication Data

US 2008/0157821 A1 Jul. 3, 2008

(30) Foreign Application Priority Data

Dec. 29, 2006 (TW) .............................. 95149697 A

(51) Int. Cl.
*G01R 19/00* (2006.01)

(52) U.S. Cl. .............................. 327/58; 327/74; 327/77

(58) Field of Classification Search ................... 327/58, 327/62, 74, 76, 77, 78
See application file for complete search history.

(56) References Cited

U.S. PATENT DOCUMENTS

| | | | | |
|---|---|---|---|---|
| 5,025,176 | A * | 6/1991 | Takeno | 327/58 |
| 6,002,295 | A * | 12/1999 | Gens et al. | 327/546 |
| 6,177,814 | B1 * | 1/2001 | Taguchi | 327/58 |
| 6,608,498 | B2 | 8/2003 | Khoury | |
| 7,180,335 | B2 * | 2/2007 | Hill | 327/58 |

* cited by examiner

*Primary Examiner*—Jeffrey S Zweizig
(74) *Attorney, Agent, or Firm*—Wei Te Chung

(57) ABSTRACT

An exemplary programming circuit (40) includes an input terminal (42) configured for receiving an external high voltage signal, a driving circuit (20), a switch circuit (43) connected between the input terminal and the driving circuit, and a feedback circuit (45). When the external high voltage signal is larger than a normal value thereof, the feedback circuit outputs a first control signal to turn off the switch circuit. When the external high voltage signal is less than the normal value thereof, the feedback circuit also outputs the first control signal to turn off the switch circuit. When the external high voltage signal is equal to the normal value thereof, the feedback circuit outputs a second control signal to turn on the switch circuit.

19 Claims, 2 Drawing Sheets

PROGRAMMING CIRCUIT WITH FEEDBACK CIRCUIT

FIELD OF THE INVENTION

The present invention relates to programming circuits, and more particularly to a programming circuit with a feedback circuit.

GENERAL BACKGROUND

A liquid crystal display (LCD) has the advantages of portability, low power consumption, and low radiation, and has been widely used in various portable information products such as notebooks, personal digital assistants (PDAs), video cameras and the likes. The LCD utilizes liquid crystal molecules to control light transmissivity of each of pixels of the LCD. The liquid crystal molecules are driven according to external video signals received by the LCD.

A conventional LCD generally employs an inversion driving method to drive the liquid crystal molecules to protect the liquid crystal molecules from decay or damage. The inversion driving method can be frame inversion, row inversion, column inversion, dot inversion, and so on. However, the LCD is prone to exhibit image flicker when the LCD employs one of the above inversion driving methods. This is usually due to an offset effect on a common voltage applied to a common electrode of the LCD.

The image flicker of the LCD can be reduced or even be eliminated via modulating the common voltage. Therefore, a driving circuit of the LCD needs to store optimal values of the common voltages in various conditions to realize modulating the common voltage. That is, programming the driving circuit to store the optimal values of the common voltages is an important step in a fabricating process of the LCD.

FIG. 3 is a top view of a conventional LCD. The LCD 1 includes an LCD panel 11 and a driving circuit 10. The driving circuit 10 is used for driving the LCD panel 11 to display images. The driving circuit 10 includes an electric source input terminal (not labeled), a ground terminal (not labeled), and a plurality of one-time programmable (OTP) units (not shown). The OTP cells are used for storing the optimal values of the common voltages. The values of the common voltages are binary. The OTP cells have various circuit structures. For example, the OTP cells can be made of fuses. When the fuse is burnt out, the corresponding OTP cell represents "1". When the fuse is not burnt out, the corresponding OTP cell represents "0". A combination of all the "1" and "0" represents the optimal values of the common voltages.

FIG. 4 is a circuit diagram of a programming circuit of the driving circuit of FIG. 3. The programming circuit 30 includes an input terminal 32, a resistor 33, a capacitor 34, and the driving circuit 10. The resistor 33 is an equivalent resistor of wires. The capacitor 34 has a filtering function. The input terminal 32 is connected to the electric source input terminal of the driving circuit 10 via the resistor 33 and is connected to ground via the capacitor 34. The ground terminal of the driving circuit 10 is connected to ground.

An external high voltage signal is inputted to the input terminal 32, and the high voltage signal is inputted to the driving circuit 10 via the resistor 33. The driving circuit 10 converts the high voltage signal into various logic signals. Some fuses are burnt out, and others are not burnt out according to the logic signals. When all the OTP cells are programmed, the external high voltage signal stops applying to the input terminal 32. Programming the driving circuit is correspondingly finished, and the optimal values of the common voltages are stored in the driving circuit.

However, in practice, the external high voltage signal may increases or decreases suddenly. When this happens, the logic signals may be wrong, some fuses should be not burnt out are burnt out, and some fuses should be burnt out are not burnt out. That is, the optimal values of the common voltages storing in the driving circuit 10 are wrong.

Furthermore, when the external high voltage signal is larger than a normal value thereof, the driving circuit 10 is liable to be damaged.

It is desired to provide an programming circuit which overcomes the above-described deficiencies.

SUMMARY

In one aspect, a programming circuit includes an input terminal configured for receiving an external high voltage signal, a driving circuit including an electric source input terminal, a switch circuit connected between the input terminal and an electric source input terminal of the driving circuit, and a feedback circuit. The feedback circuit includes a comparing circuit and a control circuit. The comparing circuit includes a first input terminal, a second input terminal, and an output terminal. The control circuit is connected between the switch circuit and the output terminal of the comparing circuit, the first input terminal of the comparing circuit is connected to the electric source input terminal of the driving circuit, the second input terminal is connected to a reference voltage source. The comparing circuit compares a voltage of the first input terminal and a reference voltage of the second input terminal, and outputs a signal to the control circuit. The control circuit correspondingly outputs a control signal to turn on or turn off the switch circuit. When the voltage of the first input terminal of the comparing circuit is equal to the reference voltage, the switch circuit is turned on; when the voltage of the first input terminal of the comparing circuit is larger than the reference voltage of the reference voltage source, the switch circuit is turned off; when the voltage of the first input terminal of the comparing circuit is less than the reference voltage, the switch circuit is turned off.

In another aspect, a programming circuit includes an input terminal configured for receiving an external high voltage signal, a driving circuit, a switch circuit connected between the input terminal and the driving circuit, and a feedback circuit. When the external high voltage signal is larger than a normal value thereof, the feedback circuit outputs a first control signal to turn off the switch circuit. When the external high voltage signal is less than the normal value thereof, the feedback circuit also outputs the first control signal to turn off the switch circuit. When the external high voltage signal is equal to the normal value thereof, the feedback circuit outputs a second control signal to turn on the switch circuit.

Other novel features and advantages will become more apparent from the following detailed description when taken in conjunction with the accompanying drawings. In the drawings, all the views are schematic.

DETAILED DESCRIPTION OF PREFERRED EMBODIMENTS

Reference will now be made to the drawings to describe various embodiments of the present invention in detail.

Figure 1:
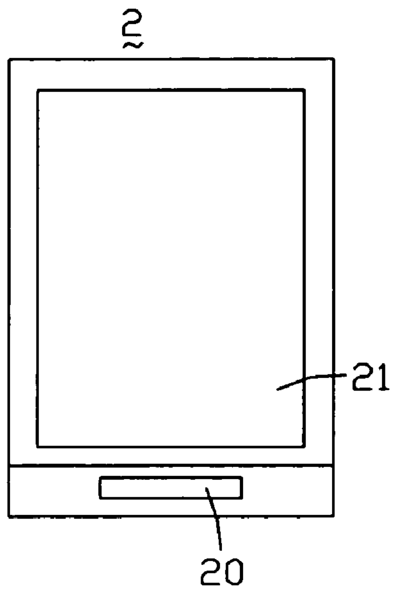
FIG. 1 is a top view of an LCD of the present invention, the LCD having a driving circuit.

FIG. 1 is a top view of an LCD of the present invention. The LCD 2 includes an LCD panel 21 and a driving circuit 20. The driving circuit 20 is used for driving the LCD panel 21 to display images. The driving circuit 20 includes an electric source input terminal (not labeled), a ground terminal (not labeled), and a plurality of OTP cells (not shown). The OTP cells are used for storing optimal values of common voltages in various conditions. The common voltages are applied to a common electrode of the LCD 2. The values of the common voltages are binary. The OTP cells have various circuit structures. For example, the OTP cells can be made of fuses. When the fuse is burnt out, the corresponding OTP cell represents "1". When the fuse is not burnt out, the corresponding OTP cell represents "0". A combination of all the "1" and "0" represents the optimal values of the common voltages.

Figure 2:
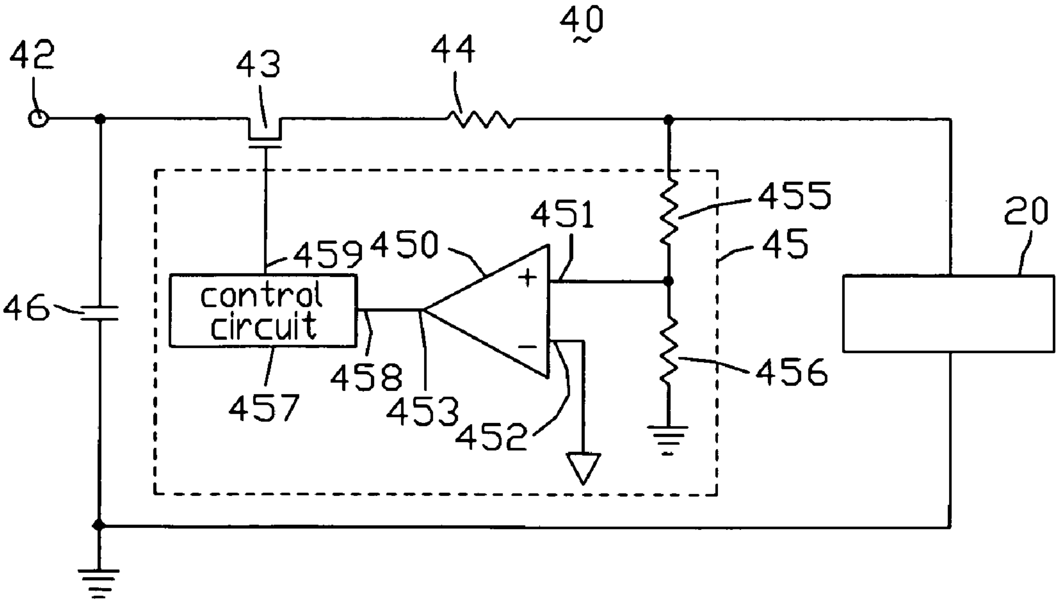
FIG. 2 is a circuit diagram of a programming circuit of the driving circuit of FIG. 1.
Figure 3:
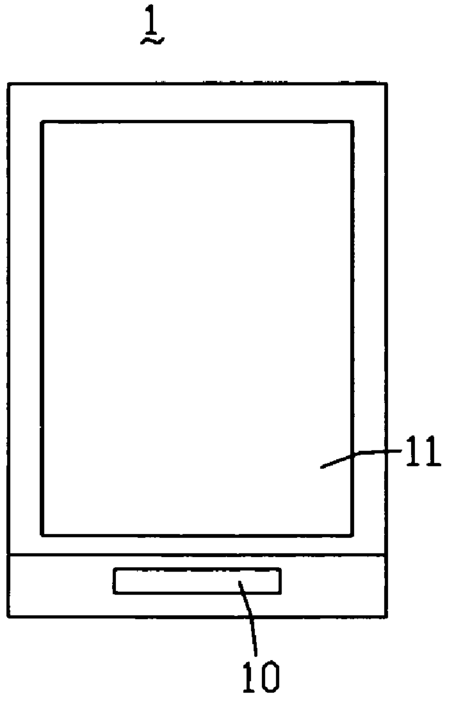
FIG. 3 (RELATED ART)
FIG. 3 is a top view of a conventional LCD, the LCD having a driving circuit.
Figure 4:
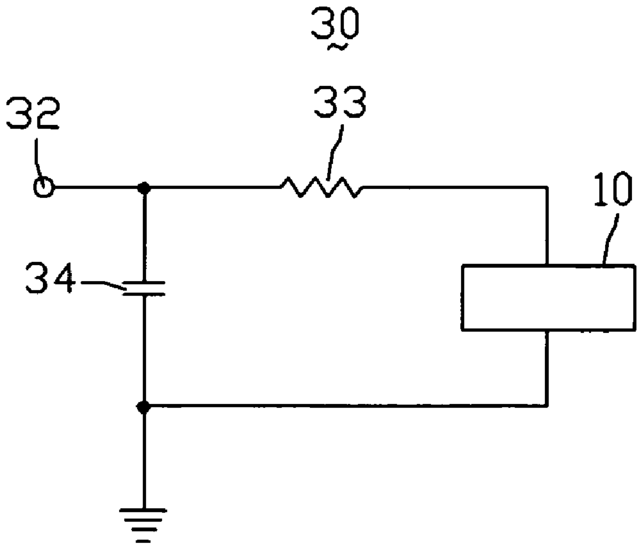
FIG. 4 (RELATED ART)
FIG. 4 is a circuit diagram of a programming circuit of the driving circuit of FIG. 3.

FIG. 2 is a circuit diagram of a programming circuit of the driving circuit of FIG. 1. The programming circuit 40 includes an input terminal 42, a switch circuit (not labeled), a resistor 44, a feedback circuit 45, a capacitor 46, and the driving circuit 20. The switch circuit can be an N-channel metal-oxide-semiconductor field-effect transistor 43. The resistor 44 is an equivalent resistor of wires. The capacitor 46 has a filtering function. The feedback circuit 45 includes a first resistor 455, a second resistor 456, a comparing circuit 450, and a control circuit 457. The comparing circuit 450 includes a first input terminal 451, a second input terminal 452, and an output terminal 453. The control circuit 457 includes an input terminal 458 and an output terminal 459. A source electrode of the transistor 43 is connected to the input terminal 42, and a drain electrode of the transistor 43 is connected to the electric source input terminal of the driving circuit 20 via the resistor 44. Further, a gate electrode of the transistor 43 is connected to the output terminal 459 of the control circuit 457. The input terminal 458 of the control circuit 457 is connected to the output terminal 453 of the comparing circuit 450. The first input terminal 451 of the comparing circuit 450 is connected to the electric source input terminal of the driving circuit 20 via the first resistor 455, the first input terminal 451 is also connected to ground via the second resistor 456. The second input terminal 452 is connected to a reference voltage source (not labeled). The input terminal 42 is connected to ground via the capacitor 46. The ground terminal of the driving circuit 20 is connected to ground.

An external high voltage signal is inputted to the input terminal 42. The control circuit 457 outputs a high level voltage signal to turn on the transistor 43. Then the high voltage signal is inputted to the driving circuit 20 via the transistor 43 and the resistor 44. The driving circuit 20 converts the high voltage signal into various logic signals. Some fuses are burnt out, and others are not burnt out according to the logic signals. When all the OTP cells are programmed, the control circuit 457 outputs a low level voltage signal to turn off the transistor 43.

The first resistor 455 and the second resistor 456 cooperatively form a voltage dividing circuit. A voltage of the second resistor 456 is inputted to the first input terminal 451 of the comparing circuit 450. The comparing circuit 450 compares the voltage of the second resistor 456 and a reference voltage of the reference voltage source. When the voltage of the second resistor 456 is larger than the reference voltage, the output terminal 453 of the comparing circuit 450 outputs a first signal. The control circuit 457 receives the first signal and correspondingly outputs a low level voltage signal to turn off the transistor 43. When the voltage of the second resistor 456 is less than the reference voltage, the output terminal 453 of the comparing circuit 450 outputs a second signal. The control circuit 457 receives the second signal and correspondingly outputs a low level voltage signal to turn off the transistor 43. When the voltage of the second resistor 456 is equal to the reference voltage, the output terminal 453 of the comparing circuit 450 outputs a third signal. The control circuit 457 receives the third signal and correspondingly outputs a high level voltage signal to turn on the transistor 43.

According to the above description, When the external high voltage signal increases or decreases suddenly, the voltage of the second resistor 456 correspondingly increases or decreases suddenly. The comparing circuit 450 correspondingly outputs the first signal or the second signal. The control circuit 457 outputs a low level voltage signal to turn off the transistor 43 regardless of the first signal or the second signal. The driving circuit 20 correspondingly stops programming the OTP cells. That is, the logic signals will not be wrong and the optimal values of the common voltages storing in the driving circuit 20 are right regardless of the external high voltage signal increases or decreases suddenly.

Because the programming circuit 40 immediately stops operation when the external high voltage signal increases suddenly, a risk of the driving circuit 20 being damaged is effectively reduced or even eliminated.

The switch circuit can be other electrical element, such as a P-channel metal-oxide-semiconductor field effect transistor, a bipolar transistor, and so on.

The switch circuit and the feedback circuit 45 can be disposed in the driving circuit 20.

It is to be understood, however, that even though numerous characteristics and advantages of preferred and exemplary embodiments have been set out in the foregoing description, together with details of the structures and functions of the embodiments, the disclosure is illustrative only; and that changes may be made in detail, especially in matters of shape, size, and arrangement of parts within the principles of the present invention to the full extent indicated by the broad general meaning of the terms in which the appended claims are expressed.

What is claimed is:

1. A programming circuit, comprising:

an input terminal configured for receiving an external high voltage signal;

a driving circuit comprising an electric source input terminal;

a switch circuit connected between the input terminal and the electric source input terminal of the driving circuit; and a feedback circuit comprising a control circuit and a comparing circuit comprising a first input terminal, a second input terminal, and an output terminal;

wherein the control circuit is connected between the switch circuit and the output terminal of the comparing circuit, the first input terminal of the comparing circuit is connected to the electric source input terminal of the driving circuit, and the second input terminal is connected to a reference voltage source; the comparing circuit compares a voltage of the first input terminal and the reference voltage of the second input terminal, and outputs a signal to the control circuit; the control circuit correspondingly outputs a control signal to turn on or turn off the switch circuit; when the voltage of the first input terminal of the comparing circuit is equal to the reference voltage, the switch circuit is turned on; when the voltage of the first input terminal of the comparing circuit is larger than the reference voltage, the switch circuit is turned off; and when the voltage of the first input terminal of comparing circuit is less than the reference voltage, the switch circuit is turned off.

2. The programming circuit as claimed in claim 1, wherein the switch circuit is a transistor, a source electrode of the transistor is connected to the input terminal, a drain electrode of the transistor is connected to the electric source input terminal of the driving circuit, and a gate electrode of the transistor is connected to the control circuit.

3. The programming circuit as claimed in claim 2, wherein the feedback circuit further comprises a first resistor and a second resistor, the first resistor is connected between the electric source input terminal of the driving circuit and the first input terminal of the comparing circuit, and the second resistor is connected between the first input terminal of the comparing circuit and ground.

4. The programming circuit as claimed in claim 3, further comprising a capacitor, wherein the capacitor is connected between the input terminal of the programming circuit and ground.

5. The programming circuit as claimed in claim 4, wherein the transistor is an N-channel metal-oxide-semiconductor field-effect transistor.

6. The programming circuit as claimed in claim 5, wherein when the control signal is to turn off the switch circuit, the control signal is a low level voltage signal, and when the control signal is to turn on the switch circuit the control signal is a high level voltage signal.

7. The programming circuit as claimed in claim 4, wherein the transistor is a P-channel metal-oxide-semiconductor field-effect transistor.

8. The programming circuit as claimed in claim 1, wherein the switch circuit is a bipolar transistor.

9. The programming circuit as claimed in claim 1, wherein the switch circuit and the feedback circuit are disposed in the driving circuit.

10. A programming circuit, comprising:

an input terminal configured for receiving an external high voltage signal;

a driving circuit;

a switch circuit connected between the input terminal of the programming circuit and the driving circuit; and a feedback circuit;

wherein when the external high voltage signal is larger than a normal value thereof, the feedback circuit outputs a first control signal to turn off the switch circuit; when the external high voltage signal is less than the normal value thereof, the feedback circuit also outputs the first control signal to turn off the switch circuit; and when the external high voltage signal is equal to the normal value thereof, the feedback circuit outputs a second control signal to turn on the switch circuit.

11. The programming circuit as claimed in claim 10, wherein the feedback circuit comprises a control circuit and a comparing circuit, and the comparing circuit comprises a first input terminal, a second input terminal, and an output terminal; the control circuit is connected between the switch circuit and the output terminal of the comparing circuit, the driving circuit comprises an electric source input terminal, the first input terminal of the comparing circuit is connected to the electric source input terminal of the driving circuit, and the second input terminal is connected to a reference voltage source.

12. The programming circuit as claimed in claim 11, wherein the switch circuit is a transistor, a source electrode of the transistor is connected to the input terminal of the programming circuit, a drain electrode of the transistor is connected to the electric source input terminal of the driving circuit, and a gate electrode of the transistor is connected to the control circuit.

13. The programming circuit as claimed in claim 12, wherein the feedback circuit further comprises a first resistor and a second resistor, the first resistor is connected between the input terminal of the driving circuit and the first input terminal of the comparing circuit, and the second resistor is connected between the first input terminal of the comparing circuit and ground.

14. The programming circuit as claimed in claim 13, further comprising a capacitor, wherein the capacitor is connected between the input terminal of the programming circuit and ground.

15. The programming circuit as claimed in claim 14, wherein the transistor is an N-channel metal-oxide-semiconductor field-effect transistor.

16. The programming circuit as claimed in claim 15, wherein the first control signal is a low level voltage signal, and the second control signal is a high level voltage signal.

17. The programming circuit as claimed in claim 14, wherein the transistor is a P-channel metal-oxide-semiconductor field-effect transistor.

18. The programming circuit as claimed in claim 10, wherein the switch circuit is a bipolar transistor.

19. The programming circuit as claimed in claim 10, wherein the switch circuit and the feedback circuit are disposed in the driving circuit.

* * * * *